US006598215B2

(12) United States Patent
Das et al.

(10) Patent No.: US 6,598,215 B2
(45) Date of Patent: Jul. 22, 2003

(54) DATAPATH DESIGN METHODOLOGY AND ROUTING APPARATUS

(75) Inventors: Sabyasachi Das, Santa Clara, CA (US); Sunil P. Khatri, Boulder, CO (US)

(73) Assignees: Intel Corporation, Santa Clara, CA (US); University of Colorado, Boulder, CO (US)

( * ) Notice: Subject to any disclaimer, the term of this patent is extended or adjusted under 35 U.S.C. 154(b) by 48 days.

(21) Appl. No.: 09/820,864

(22) Filed: Mar. 30, 2001

(65) Prior Publication Data

US 2002/0144227 A1 Oct. 3, 2002

(51) Int. Cl.[7] .............................................. G06F 17/50
(52) U.S. Cl. ......................................... 716/12; 716/14
(58) Field of Search ................................ 716/12, 13, 8, 716/10, 9, 14; 455/418, 419, 452; 375/130, 377; 370/347, 332, 337, 442

(56) References Cited

U.S. PATENT DOCUMENTS

| 5,519,627 A | * | 5/1996 | Mahmood et al. | ............. 716/18 |
| 5,640,327 A | * | 6/1997 | Ting | ............................. 716/12 |
| 5,812,417 A | * | 9/1998 | Young | ......................... 716/10 |
| 6,327,697 B1 | * | 12/2001 | Ghosh | ......................... 716/12 |

OTHER PUBLICATIONS

R.X.T. Nijssen et al., "Regular layout Generation of Logically Optimized Datapaths", *Proceeding of the International Symposium on Physical Design*, pp. 42–47, 1997.

Naveen Buddi, et al., "Layout Synthesis for Datapath Designs", *Proceedings of European Design Automation Conference*, pp. 86–90, 1995.

Terry Tao Ye, et al., "Datapath Placement with Regularity", *Proceedings of IEEE/ACM International Conference on Computer–Aided Design*, pp. 264–270, 2000.

Serken Askar et al., "Analytical Approach to Custom Datapath Design", *Proceedings of IEEE/ACM International Conference on Computer–Aided Design*, pp. 98–101, 199.

Jaewon Kim, et al., "A Timing–driven Data Path Layout Synthesis with Integer Programming", *Proceedings of IEEE/ACM International Conference on Computer Aided Design*, pp. 716–719, 1995.

Suresh Ramen et al., "Datapath Routing Based on A Decongestion Metric", *Proceedings of the ACM International Symposium on Physical Design*, pp. 122–127, 2000.

Amit Chowdhary et al., "A General Approach for Regularity Extraction in Datapath Circuits", *Proceedings of IEEE/ACM International Conference on Computer–Aided Design*, pp. 332–339, 1998.

Srinivasa R. Arikati, et al., "A Signature Based Approach to Regularity Extraction", *Proceedings of IEEE/ACM International Conference on Computer–Aided Design*, pp. 542–545, 1997.

Soha Hassoun et al., "Regularity Extraction Via Clan–Based Structural Circuit Decomposition", *Proceedings of IEEE/ACM International Conference on Computer–Aided Design*, pp. 414–418, 1999.

http://www.sycon-design.com/Products/Tempest-Block/tempest-block.html, pp. 1–3, Apr. 4, 2001.

* cited by examiner

*Primary Examiner*—Tuan T. Lam
*Assistant Examiner*—Linh Nguyen
(74) *Attorney, Agent, or Firm*—Antonelli, Terry, Stout & Kraus, LLP

(57) ABSTRACT

A method and routing device are provided for routing a datapath design. Regularity may be extracted among routing connections of the datapath design. A representative bit-slice may be selected and one representative net from each net cluster in the representative bit-slice may be routed. The route of each routed net in each net cluster may be propagated to a remaining routes in each net cluster.

43 Claims, 11 Drawing Sheets

BIT K

DATAPATH DESIGN METHODOLOGY AND ROUTING APPARATUS

FIELD

The present invention is directed to a routing methodology.

BACKGROUND

As technology migrates toward ultra deep sub-micron feature sizes, designs are becoming increasingly complex with very aggressive goals. For example, microprocessor designs may target operating frequencies of upwards to 4 or 5 GHz, and desire process feature sizes less than or equal to 0.13 μm. A microprocessor may contain four different types of circuits, namely interface circuits, memory, datapaths and random (controller) circuits. Datapaths are an important part of the design because a majority of computations are performed in these units. Datapath circuits typically account for a large percentage of all the transistors of a microprocessor and consume a large part of the designer's time and effort. To a large extent, the performance of the datapath may determine the performance of the entire integrated circuit (IC). Traditional design automation methodologies are not well suited for the design of high-performance datapaths because they do not exploit the structural regularity of bit-slices. As a result, datapath blocks may be manually designed resulting in a significantly larger design time and cost.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings wherein like reference numerals refer to like elements and wherein.

DETAILED DESCRIPTION

Figure 1:
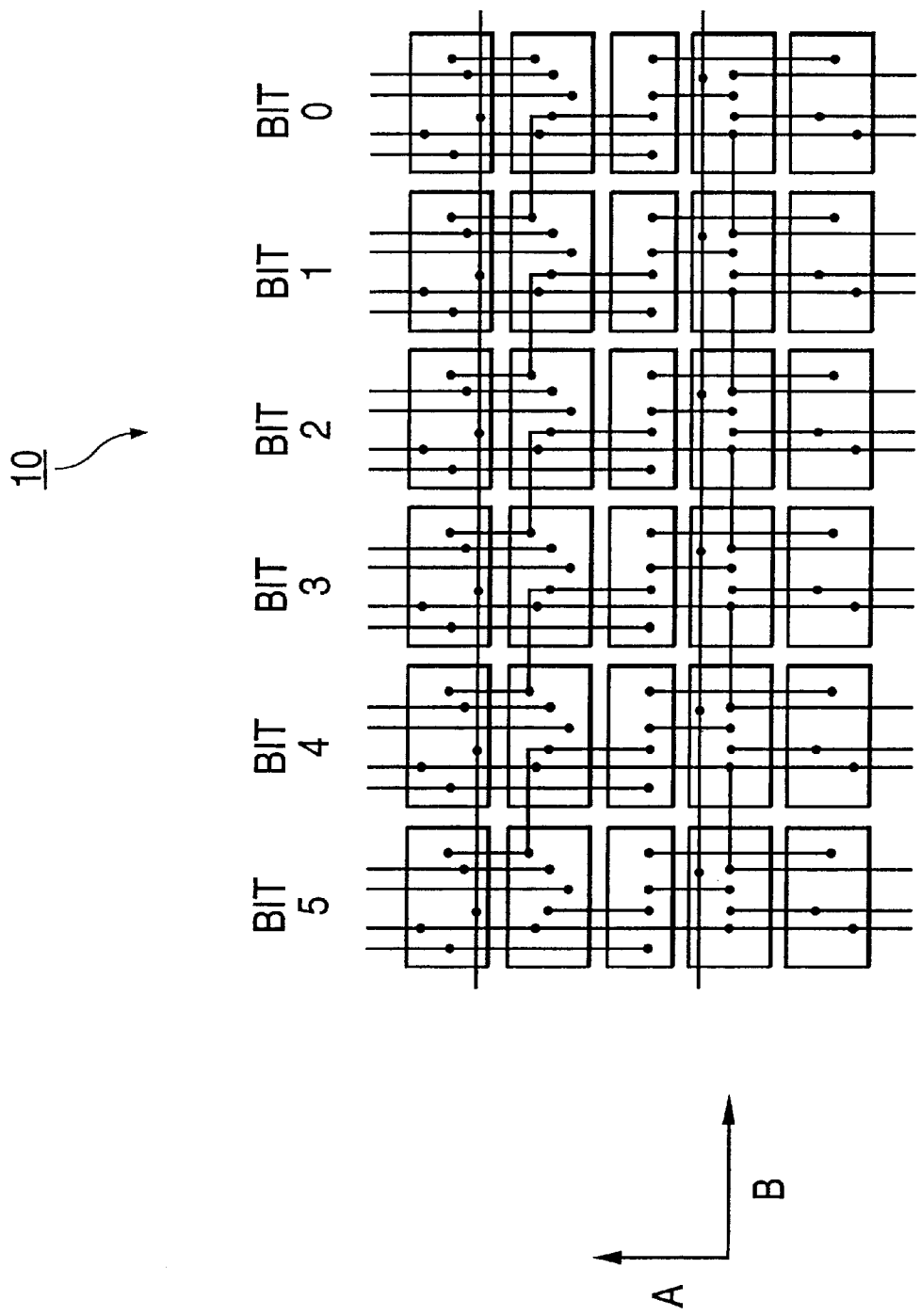
FIG. 1 is a datapath block structure.

Before beginning a detailed description of the subject invention, mention of the following is in order. When appropriate, like reference numerals and characters may be used to designate identical, corresponding or similar components in differing figure drawings. Further, in the detailed description to follow, example values may be given although the present invention is not limited to these descriptions. Further, arrangements may be shown in block form in order to avoid obscuring the invention, and also in view of the fact that specifics with respect to implementation of such block diagram arrangements may be highly dependent upon the platform within which the present invention is to be implemented. That is, such specifics should be well within the purview of one skilled in the art. Where specific details (e.g., circuits, flowcharts) are set forth in order to describe example embodiments of the invention, it should be apparent to one skilled in the art that the invention can be practiced without, or with variation of, these specific details.

The datapath routing methodology of one embodiment of the present invention exploits the unique feature of datapaths, namely their regularity. Datapaths may include regular structures (or bit-slices) that may be replicated N times (in an N-bit datapath design). The interconnections between these replicated bit-slices may also be very regular. In the routing methodology described below, interconnect regularity among bit-slices is extracted. A net-cluster is defined as a collection of similarly structured nets present across different bit-slices. Two clustering schemes are provided to extract such net-clusters, namely a footprint-driven clustering algorithm (or methodology) and an instance-driven clustering algorithm (or methodology). A representative bit-slice is selected to perform a strap-based routing (which optimally finds the shortest path between two points if the path is available) on a member net of each net-cluster. Routing may also be performed for cross-bit nets by using data for the representative bit-slice. Cross-bit nets are nets for which the source and destination pins do not belong to same bit-slice. In this situation, the other bit-slice's pins may be virtually instantiated into the representative slice. Once the routing of the representative bit-slice is complete, for each routed net, the route may be propagated to all other nets in its net-cluster.

One challenge of detailed routing is to route unique paths so that no two paths touch. Therefore, in a chip design, the route may jump between layers such as Metal1, Metal2, Metal3 and Polysilicon. Naturally, a router should be programmed to find a path that does not result in a short.

Embodiments of the present invention may perform the detailed routing on a single bit slice, and infer the routing for all bit-slices based on nets within the net cluster. Since only a small fraction of nets present in the design are routed, large gains in routing design speed may be obtained.

In integrated circuit designs, standard-cells or custom cells may be utilized as building blocks for the circuit being implemented. A standard-cell may implement a simple logic function utilizing a few transistors. In some cases, designers may create larger custom-cells that may contain a plurality of standard cells. Cell designers may create a plurality of standard-cells/custom-cells (with different functions, drive strengths and other characteristics) and form a library of cells. Datapaths may be commonly found in microprocessors, digital signal processors (DSP) and graphics ICs. In datapaths, the same logic may be repeated multiple times. A bit-slice may be the logic corresponding to a particular bit of the datapath. The logic of each bit-slice may be constructed out of library cells. Further, N bit-slices may abut next to each other to obtain the design of an N-bit datapath. The layout width of all bit-slices may be identical and be referred to as the bit-pitch or pitch.

FIG. 1 shows an example datapath 10 having six vertical bit-slices. Other configurations and numbers of bit-slices are also available. Data may flow vertically (direction of arrow A) and control information may flow horizontally (direction of arrow B). FIG. 1 shows that the datapath 10 includes six vertical bit-slices (labelled Bit 0, Bit 1, Bit 2, Bit 3, Bit 4 and Bit 5) and five regular row-type structures. In an N-bit datapath, each row may have N rectangular areas and each of those areas may have an identical width (i.e., identical to the bit-pitch). In some design styles, designers may specifically create cells whose width is equal to the bit-pitch. These cells may be called datapath-cells. In standard-cell based datapath styles, at least one library cell may fit into a datapath bit-pitch. A datapath library cell may be referred to as a master-cell.

Figure 2:
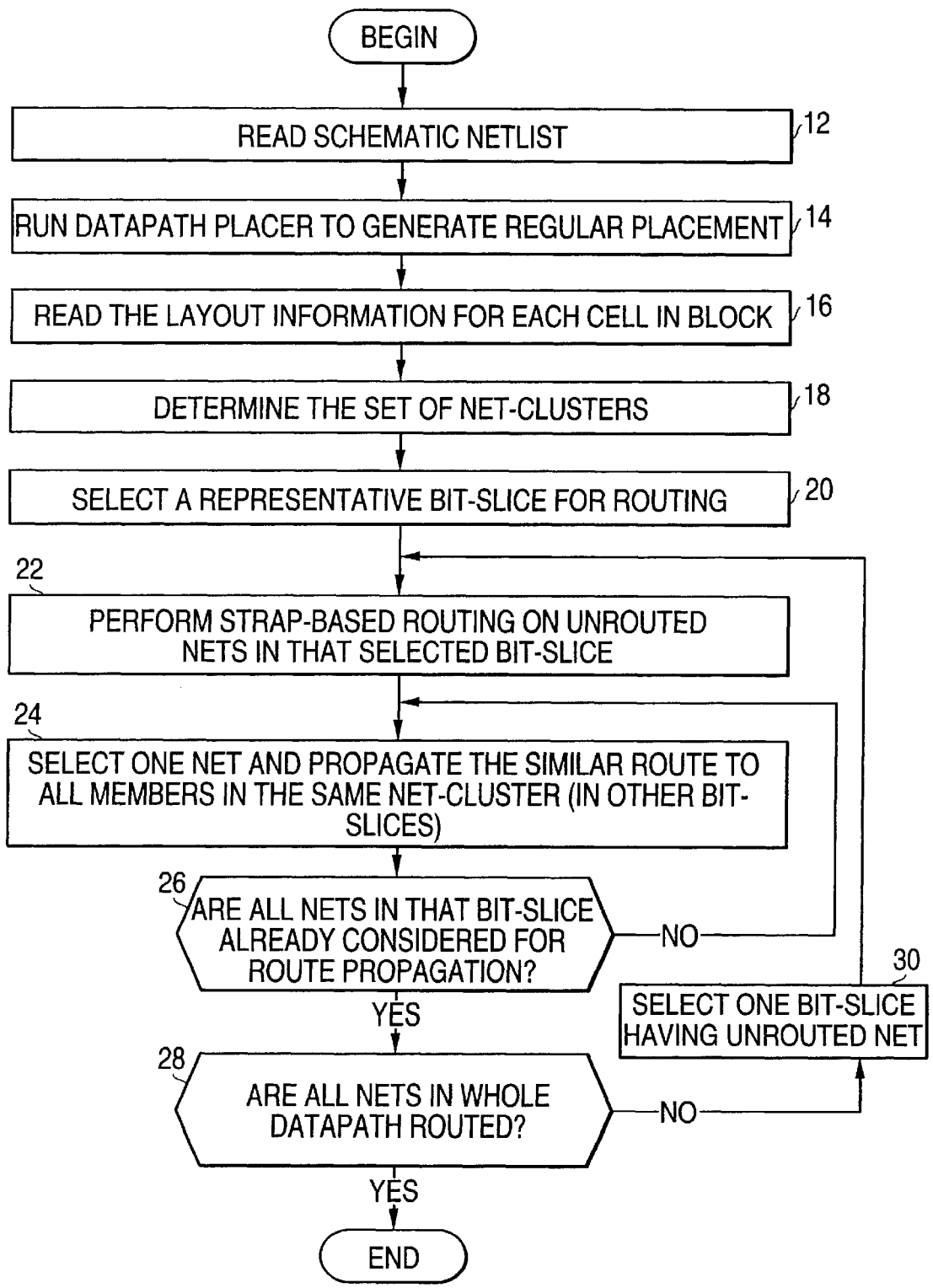
FIG. 2 is a flowchart of a routing methodology according to an example embodiment of the present invention.

FIG. 2 is a flowchart of a methodology for an example embodiment of the present invention. Other embodiments and orders of the methodology are also within the scope of the present invention. In summary, after determining schematic and layout information of the datapath design, regularity of the datapath routes may be extracted. A single bit-slice may be routed by inferring connections of other bit-slices using the extracted regularity information.

FIG. 2 illustrates the following methodology that will be described below in greater detail. In block 12, a schematic netlist may be read. This may be followed by block 14 in which a datapath placer may be run to generate regular placement. In block 16, layout information may be read for each cell in the block. A set of net-clusters may be determined in block 18. A representative bit-slice may be selected for routing in block 20. Strap-based routing may be performed on unrouted nets in the selected bit-slice in block 22. In block 24, one net may be selected and the route may be propagated to all the members in the same net-cluster. In block 26, a determination is made whether all the nets in that bit-slice have already been considered for route propagation. If not, then the methodology proceeds back to block 24. If affirmative, then a determination is made in block 28 whether all the nets in the whole datapath have been routed. If so, then the methodology may end. If not, then one bit-slice may be selected having an unrouted net in block 30 and the methodology may proceed back to block 22. The blocks 22, 24, 26 and 28 may be repeated until all the nets in the datapath have been routed. More specific details of the methodology shown in FIG. 2 will now be provided.

In block 12 a schematic (logic) netlist of the whole block may be read (or obtained). This may include several instances of library cells. In a top level of hierarchy, all the connections between instances may be specified. In a lower level of hierarchy, logical details of the library cells (corresponding to the instances) may be specified.

Instances of the master-cells of the datapath block may be placed in a structured manner in block 14. Several datapath placement algorithms are known such as "Layout synthesis for datapath designs" pp.86–90 (1995) by N. Buddi, M. Chrzanowska-Jeske and C. Saxe, and "Data path placement with regularity" in Proceedings of IEEE/ACM International Conference on Computer-Aided Design, pp. 264–270 (2000) by T. Ve and G. D. Micheli. Embodiments of the present invention may utilize an industrial datapath placement tool to produce a regular placement in block 14. Alternately, all the instances may be manually placed in a regular manner.

In block 16, the layout information of the library cells (corresponding to those instances) that make up the datapath may be read. Details about the pins of the cells and the blockages present in the datapath block may be obtained. The pin locations in the library cells may be the end-points of the desired routes. In addition, pin information about the top-level block (i.e., the interface I/O pins) may also be read in block 16.

Net-clusters may be determined in block 18. In a datapath design, several regular structures may be present across multiple bit-slices. Existing algorithms to find regular instance structures in the datapath may be utilized. See "A general approach for regularity extraction in datapath circuits" in Proceedings of IEEE/ACM International Conference on Computer-Aided Design, pp. 332–339 (1998) by Chowdhury et al., "A signature based approach to regularity extraction" in Proceedings of IEEE/ACM International Conference on Computer-Aided Design, pp. 542–545 (1997) by Arikati et al., "Regularity extraction via claim-based structural circuit decomposition" in Proceedings of IEEE/ACM International Conference on Computer-Aided Design, pp. 414–418 (1999) by Hassoun et al. and "Regular layout generation of logically optimized datapaths" in Proceedings of the International Symposium on Physical Design, pp. 42–47 (1997) by Nijssen et al.

Regular net structures present in different bit-slices may be extracted. A net-cluster may be a collection of nets (spread over different bit-slices) in which all the nets have similar connections. In particular, for one embodiment if two nets (e.g., net1 and net2) belong to a net-cluster, then there exists a integer k, such that: net1 and net2 contain the same number of pins and for each pin p of $net_1$ with co-ordinates $(x_p, y_p)$, there exists a pin q of net2 with co-ordinates $(x_q, y_q)$, such that $$y_p = y_q$$

$$|x_p - x_q| = k \cdot \text{bit\_pitch}$$

To denote a net-cluster A with nets N0, N1, N2, N3, N4, the following notation may be used:

$$A = \{N0, N1, N2, N3, N4\}$$

In accordance with embodiments of the present invention, different algorithms (or methodologies) may be used to identify the net-clusters in block 18, namely a footprint-driven clustering algorithm and an instance-driven clustering algorithm. The footprint-driven clustering algorithm may create net-clusters based on the names of pins and master-cells in the datapath. On the other hand, the instance-driven clustering algorithm may extract clusters based on position information of the pins of nets.

Figure 3:
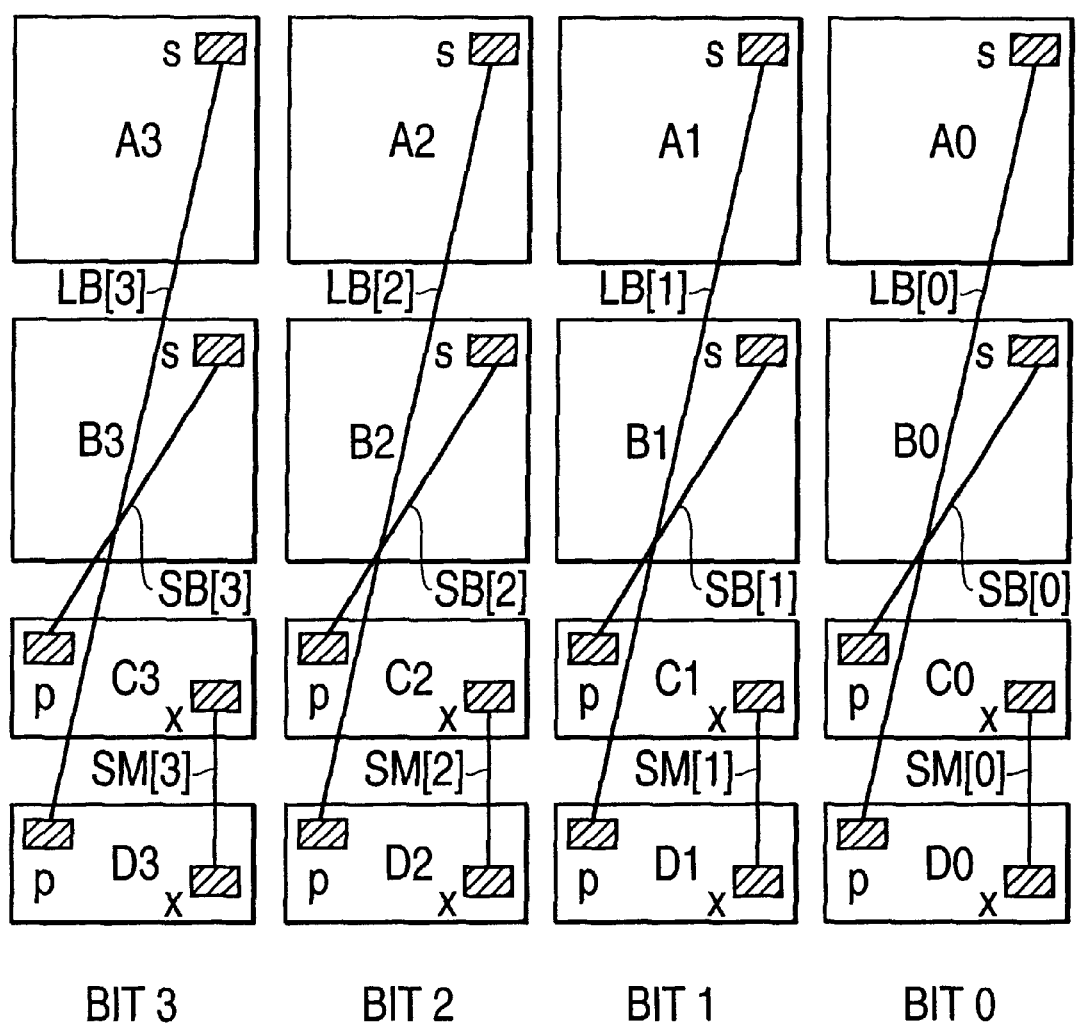
FIG. 3 is an example datapath design used to illustrate a footprint-driven clustering algorithm.

The footprint-driven clustering algorithm will now be described. Datapath designers typically follow a regular naming scheme in order to effectively manage and debug the datapath design. The footprint-driven cluster algorithm may exploit this naming regularity. FIG. 3 shows a 4-bit (namely Bit 0, Bit 1, Bit 2 and Bit 3)datapath that follows a regular naming scheme. A global footprint of a net may be a string that is created by linking together the names of the net pins (of the connecting instances) and the names of master-cells of those instances. Concatenation may be performed in lexicographical order. The detailed footprint of a net may be a string that is created by lexicographically linking together the names of all the connecting instances and the name of the net. The footprint-driven clustering algorithm may be represented by the following Algorithm 1.

Algorithm 1: Footprint-Driven Clustering
NetNames=findAllNetNames(designName)
GFs=findGlobalFootPrints(NetNames)
AllGroupsOfNets=NULL
for each unique global footprint (ugf) do
   NewGroups=getGroupsOfNets(ugf)
   AllGroupsOfNets=AllGroupsOfNets+NewGroups
end for
AllNetClusters=NULL
for each Group in AllGroupsOfNets do
   NetsInGroup=findNetsInGroup(Group)
   DFs=findDetailedFootPrints(NetsInGroup)
   NewNetClusters=CreateNetCluster(DFs, NetsInGroup)
   AllNetClusters=AllNetCluster+NewNetClusters
end for
Return AllNetClusters In the first part of Algorithm 1, a global footprint may be calculated for all the nets. If there are N nets, then there may be a similar number of global footprints. A number of groups of nets may be formed such that: (1) all nets in a single group have the same global footprint, and (2) no two nets belonging to different groups have the same global footprint.

In the second part of Algorithm 1, one group may be considered at a time. One or more net-clusters may be created from each group. Detailed footprints may be generated for each member net in a group. If the indices of the names in the detailed footprints of two nets differ by a constant k, then these two nets may belong to a single net-cluster. Otherwise, these two nets may belong to different net-clusters.

An example of the footprint-driven clustering algorithm may be illustrated by applying the algorithm on the datapath design shown in FIG. 3. For ease of illustration, this discussion only relates to two-pin nets although other numbers of pins are also possible. FIG. 3 shows instances A0, A1, A2, A3, B0, B1, B2, B3, C0, C1, C2, C3, D0, D1, D2 and D3. Each of the instances in this figure includes a pin such as pin s, pin p and pin x. The lines connecting the pins represent nets and are labeled LB[0], LB[1], LB[2], LB[3], SB[0], SB[1], SB[2], SB[3], SM[0], SM[1], SM[2]and SM[3].

In this example, the instances A3, A2, A1 and A0 all belong to the master-cell M__1 and the instances B3, B2, B1 and B0 all belong to the master-cell M__1. The instances C3, C2, C1 and C0 and the instances D3, D2, D1 and D0 all belong to the master-cell M__2. The nets in bit-slice 0 are: net LB [0] connects pin s of instance A0 to pin p of instance D0; net SB [0] connects pin s of instance B0 to pin p of instance C0; and net SM [0] connects pin x of instance C0 to pin x of instance D0. The nets in bit-slice 1 are: net LB [1] connects pin s of instance A1 to pin p of instance D1; net SB [1] connects pin s of instance B1 to pin p of instance C1; and net SM [1] connects pin x of instance C1 to pin x of instance D1. The nets in bit-slice 2 are: net LB [2] connects pin s of instance A1 to pin p of instance D2; net SB [2] connects pin s of instance B2 to pin p of instance C2; and net SM [2] connects pin x of instance C2 to pin x of instance D2. The nets in bit-slice 3 are: net LB [3] connects pin of instance A3 to pin p of instance D3; net SB [3] connects pin s of instance B3 to pin p of instance C3; and net SM [3] connects pin x of instance C3 to pin x of instance D3.

In accordance with the first part of the algorithm, the global footprints of all the nets may be determined and groups may be determined based on the global footprints. For example, the global footprint of net LB [3] is a string containing the pin s, the master-cell M__1 the pin p and the master-cell M__2. Net SB [3] has the same global footprint as net LB [3]. The global footprint of net SM [3] contains the pin x, the master-cell M__2, the pin x and the master-cell M__2. After computing the global footprints of all nets in this manner, the nets having same global footprint may be grouped together. Accordingly, the net SB [3] and the net LB [3] may belong to a single group. Two groups are obtained, namely:

(a) Group-1 has nets LB [3], LB [2], LB [1], LB [0], SB [3], SB [2], SB [1], SB [0]

(b) Group-2 has nets SM [3], SM [2], SM [1], SM [0].

In accordance with the second part of the algorithm, the net-clusters are then formed from the previously obtained net groups. The groups are considered one at a time. First, the detailed footprint is determined for each net in Group-1. The detailed footprint of net LB [3] is a string containing A3, LB [3] and D3. Similarly, the detailed footprint of net LB [2] is a string containing A2, LB [2] and D2. The detailed footprint of net SB [3] is a string containing B3, SB [3] and C3. After determining the detailed footprints, the footprints may be analyzed to determine net-clusters. In the detailed footprints of nets LB[3] and LB [2], the indices of the names differ by k=1. Therefore, the nets LB [3] and LB [2] may belong to the same net-cluster. In the detailed footprints of nets LB [3] and SB [3], the names differ and hence these two nets belong to different net-clusters. The following two net-clusters may be formed from Group-1:

(a) Net-Cluster-1={LB [3], LB [2], LB [1], LB [0]}

(b) Net-Cluster-2={SB [3], SB [2], SB [1], SB [0]}.

Next, the detailed footprint analysis may be performed on each net in Group-2 to generate another net-cluster, namely:

(a) Net-Cluster-3={SM [3], SM [2], SM [1], SM [0]}.

In summary, if performed on the datapath design of FIG. 3, the footprint-driven clustering algorithm produces three net-clusters. The footprint-driven clustering algorithm should identify most net-clusters. However, if some nets were not named using a uniform naming scheme, then the footprint-driven clustering algorithm may not identify their corresponding net-clusters. For example, a non-uniform naming scheme may occur when a logic synthesis tool creates the schematic. Synthesis tools may assign synthesized names (typically randomly generated) for unnamed nets. The instance-driven clustering algorithm may identify such nets and create the appropriate net-clusters. The instance-driven clustering algorithm will now be described.

The instance-driven clustering algorithm may be a two-step technique with a smaller problem size since the nets that are already assigned to a net-cluster are not considered. For each un-clustered net, the global footprint may be determined to form candidate groups in a similar manner as in the footprint-driven clustering algorithm. One group may be considered at a time and net-clusters may be created from that one group. For each net (within a group), the co-ordinates of the pins involved may be analyzed. For example, two nets netA and netb may be connected to P pins each. After sorting the pin co-ordinates by their Y-coordinate value, the pins of netA are assumed to be at $(x^1_a, y^1_a)$, $(x^2_a, y^2_a)$ and the pins of netB are assumed to be at $(x^1_b, y^1_b)$, $(x^2_b,$ $y_b^2$), ..., $(x_b^P, y_b^P)$. The two nets belong to the same net-cluster if the following 2·P conditions are satisfied:

$$y_a^j = y_b^j \text{ (for } j=1, 2, \ldots, P)$$

$$|x_a^j - x_b^j| = k\text{·bit\_pitch (for } j=1, 2, \ldots, P \text{ and } k \in [1, N-1])$$

If the pins of any two nets do not satisfy these conditions, then the nets belong to different net-clusters. By applying this test to all pairs of nets, then all the net-clusters in the datapath design may be determined.

Figure 4:
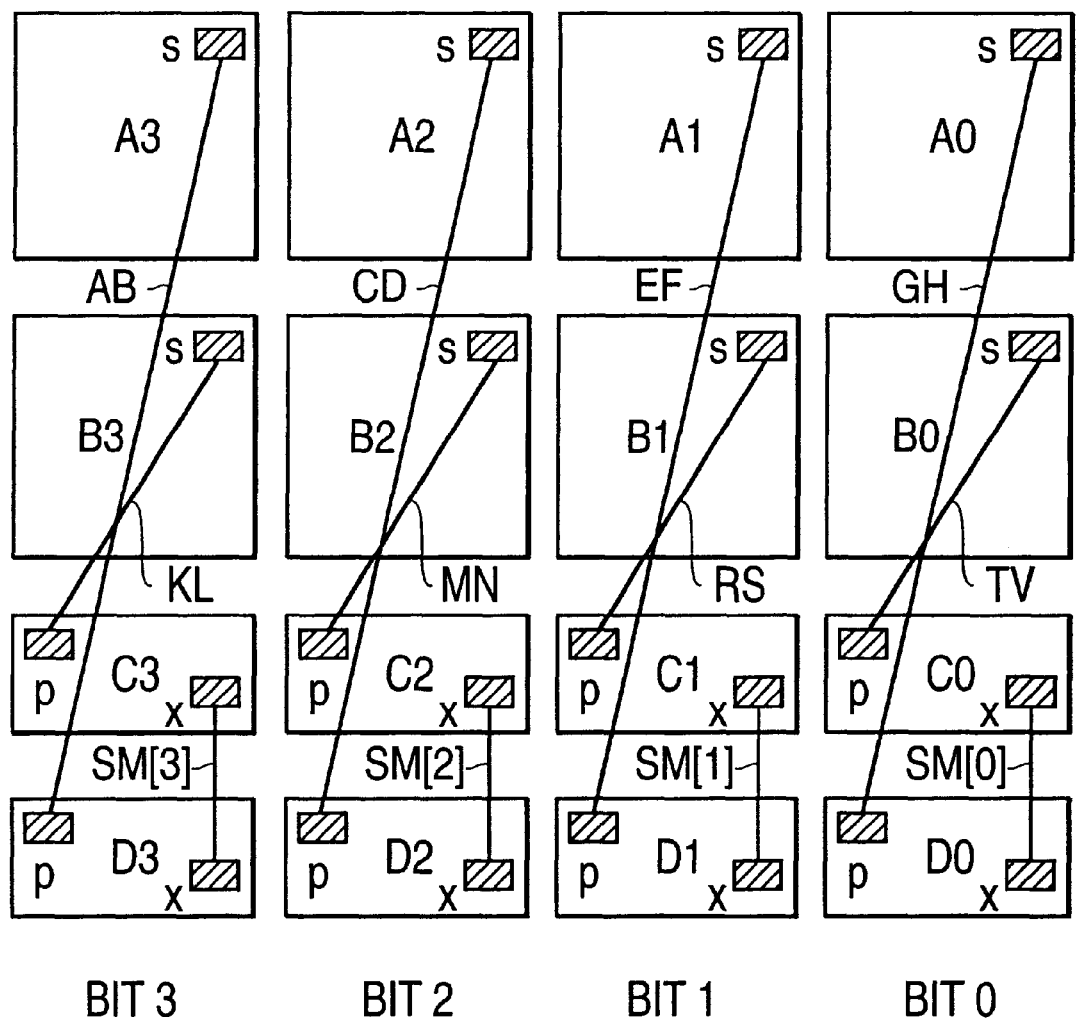
FIG. 4 is an example datapath design used to illustrate an instance-driven clustering algorithm.

The instance-driven clustering algorithm may be illustrated using the datapath design shown in FIG. 4. FIG. 4 is similar to FIG. 3 except for the names of some of the nets. For ease of illustration, this discussion only relates to two-pin nets although other numbers of pins are also possible. It is assumed that the designer explicitly specified the names of nets SM [3], SM [2], SM [1], SM [0]. On the other hand, no name was specified for the other eight nets, and therefore a logic synthesis tool may generate the net names AB, CD, EF, GH, KL, MN, RS, TV.

After running the footprint-driven clustering algorithm, a net-cluster may be created containing the nets SM [3], SM [2], SM [1], SM [0]. As a result, these four nets will not be considered by the instance-driven clustering algorithm. The instance-driven clustering algorithm may obtain a group containing the nets AB, CD, EF, GH, KL, MN, RS, TV. A net (such as AB) and its pins may be selected. A net-cluster may then be created containing only this net. Another net (such as CD) may be selected and the four conditions (since P=2) may be tested on its pin co-ordinates and the pin coordinates of any net of each existing net-cluster in that group. In this example, the pin coordinates of the nets CD and AB satisfy the four conditions and therefore the net CD may be added to the net-cluster containing the net AB. If the net RS is chosen next, then the four conditions may be tested on the pin coordinates of the net RS and any net in the net-cluster containing the nets AB and CD. The conditions may fail and therefore a new net-cluster may be created containing only the net RS. This process may be continued until all the nets in each group have been considered. As a result, the following two net-clusters may be obtained:

Net-Cluster-1={AB, CD, EF, GH}

Net-Cluster-2={KL, MN, RS, TV}.

Figure 5:
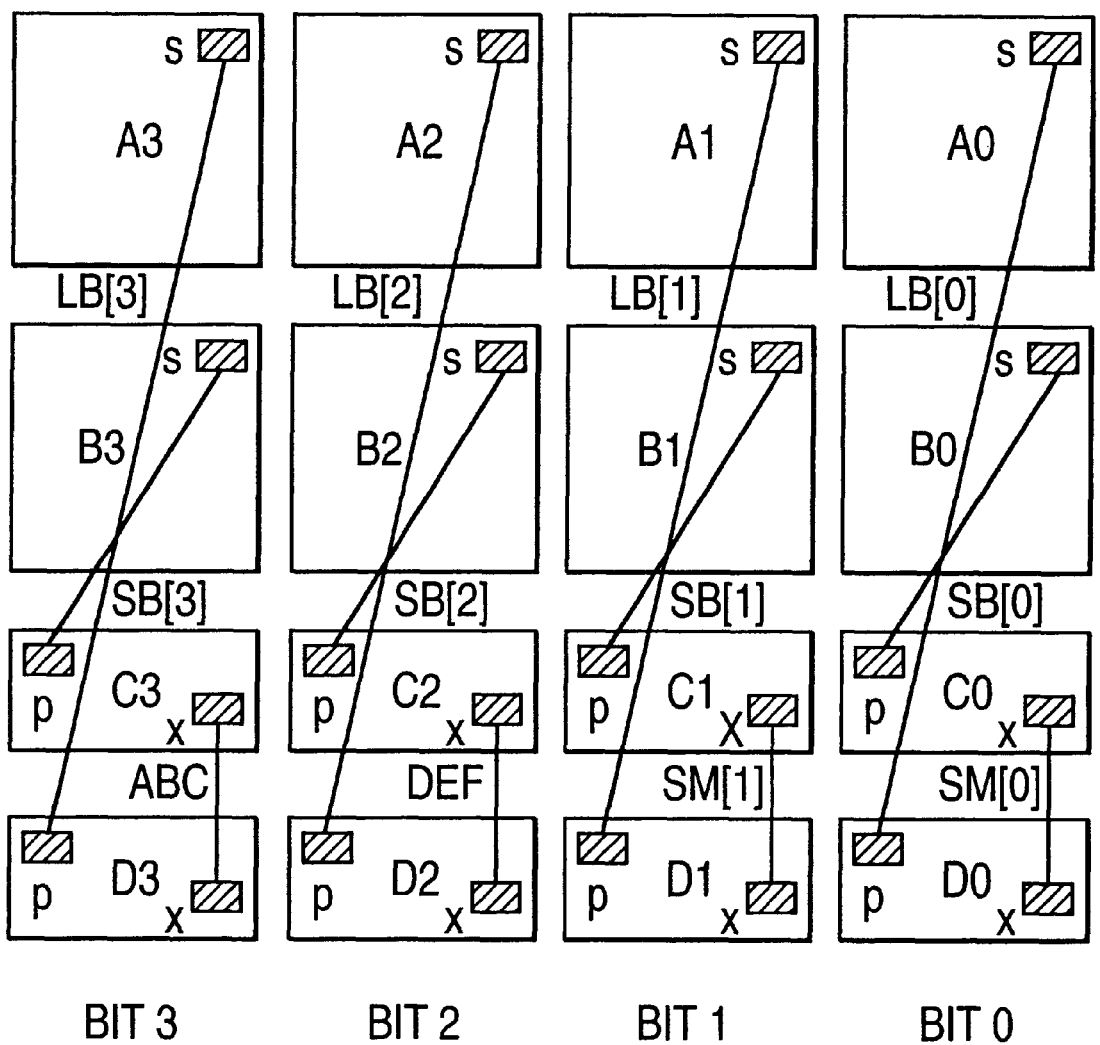
FIG. 5 is an example datapath design used to illustrate cluster merging.

Cluster merging may occur after running both the footprint-driven clustering algorithm and the instance-driven clustering algorithm. This may be useful because some nets in a cluster are properly named while others are not. This may result in the fragmentation of clusters. The datapath design shown in FIG. 5 will be used to illustrate an example of how cluster merging works. First, the footprint-driven clustering algorithm obtains three net-clusters:

Cluster1={LB [3], LB [2], LB [1], LB [0]};

Cluster2={SM [1], SM [0]};

Cluster3={SB [3], SB [2], SB [1], SB [0]}.

The instance-driven clustering algorithm identifies an additional cluster:

Cluster4={ABC,DEF}.

The cluster merging technique may now be applied. Only those candidate clusters that have less than N member nets are considered, where N is the number of bits in the datapath design. This is because net-clusters with N nets cannot be grown further. In this example, only Cluster2 and Cluster4 are considered. One representative net may be selected from each net-cluster. The co-ordinates of the pins connected to these representative nets may be sorted and checked to determine whether the 2·P conditions (assuming that each of these nets are connected to P pins) described in the instance-driven clustering algorithm are satisfied. If the conditions are satisfied, then the two net-clusters may be merged. After each merging operation, if the number of nets in the merged cluster becomes equal to N, then it is not considered as a candidate for further merging. Otherwise, the merged cluster may be retained in the candidate cluster list. Cluster2 and Cluster4 may be merged to form a new cluster as follows:

ClusterNew={ABC, DEF, SM [1], SM [0]}.

This process may be continued on all remaining candidate clusters until no further merging is possible. The overall net-cluster determination flow may be represented by the following Algorithm 2.

Algorithm 2: Net-Cluster Determination Flow
fpdClusters=getFootprintDrivenClusters(allNets)
RemainingNets=getUnClusteredNets(allNets, fpdClusters)
idClusters=getInstanceDrivenClusters(remainingNets)
finalClusters=getMergedClusters(fpdClusters, idClusters)
return finalClusters Selection of the representative bit-slice (block 20 in FIG. 2) will now be described. After identifying all the net-clusters, the nets may be routed. Unlike other routing techniques, embodiments of the present invention may not perform the routing for all nets in the datapath design. Instead, embodiments of the present invention may explicitly route a single bit-slice and then propagate the route to other bit-slices. Therefore, other nets in a net-cluster may be routed implicitly. This results in highly regular routes and a significant reduction in router run-time. These benefits may be significant as compared with traditional routing approaches that perform explicit routing for each net in the design.

A representative bit-slice may be selected on which to perform explicit routing. A net has same-bit connections if all the pins connected to that net belong to a single bit-slice. This type of net is called a same-bit net. On the other hand, if all the pins of a net do not belong to the same single bit-slice, then the connection may be a cross-bit connection. This type of net is called a cross-bit net. If a net X has a cross-bit connection from bit-slice S (source) to bit-slice D (destination), then that connection may be denoted as {X: SX, DX}; where SX≠DX.

Figure 6:
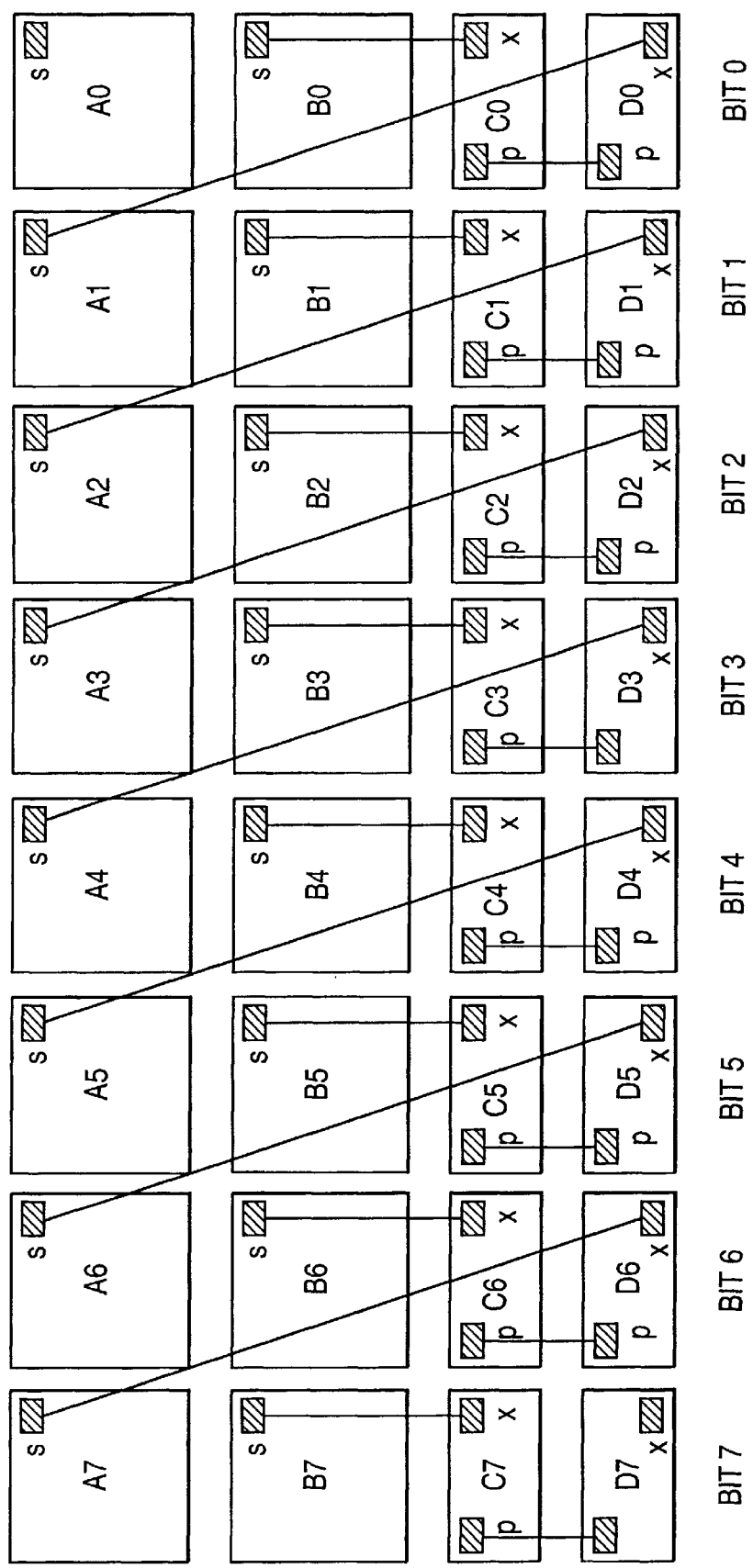
FIG. 6 is an example datapath design used to illustrate backward cross-bit connections.

There may be two types of cross-bit connections, namely forward and backward cross-bit connections. A first type of cross-bit connection is a backward cross-bit connection of degree 1. For {X: SX, DX}, if (SX−DX)=l (where l>0) then the net X has a backward cross-bit connectivity of degree 1. FIG. 6 shows seven nets having a backward cross-bit connection of degree 1.

Figure 7:
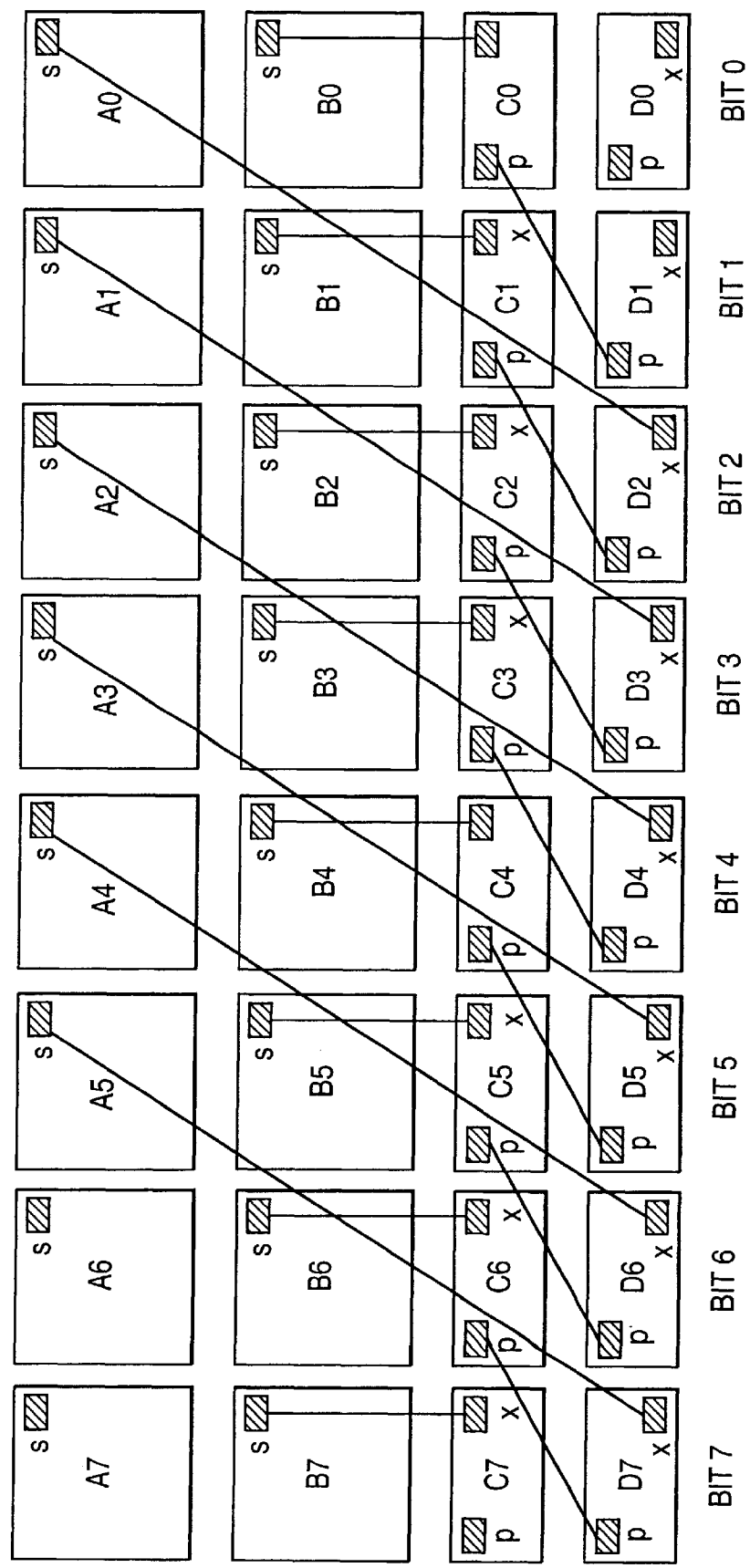
FIG. 7 is an example datapath design used to illustrate forward cross-bit connections.

A second type of cross-bit connection is a forward cross-bit connection of degree 1. For {X: SX, DX}, if (DX−SX)=l (where l>0) then the net X has a forward cross-bit connectivity of degree 1. FIG. 7 shows thirteen nets having a forward cross-bit connection of degrees 1 and 2.

In a typical datapath design, most nets have same-bit connections. If the nets in a net-cluster have cross-bit connections, then the net-cluster contains less than N nets.

To determine the representative bit-slice, the datapath design may be conceptually considered to have an infinite number of bit-slices on the left of the N th bit-slice and on the right of the 0 th bit-slice. In this way, each of the N bit-slices has an identical number of nets. In such a structure, any of the N bit-slices may be used as the representative bit-slice for explicit routing.

When performing route propagation, all routes to or from bit-slices to the left of the N th bit-slice or to the right of the 0 th slice may be disregarded.

The routing of the nets in the selected bit-slice (block 22) will now be discussed. As stated above, the datapath cells may be placed in a row-like fashion. After placement, most of the connections may be confined within nearby rows. Many connections may occur between row i and row (i+1). Based on this observation, the memory requirement for the router (or router device) may be fine-tuned by loading the information pertaining to the required rows of the representative bit-slice rather than loading the entire bit-slice.

Embodiments of the present invention may utilize strap-based routing. A strap may be a straight segment that can be either vertical or horizontal. A strap between points $(x_i; y_j)$ to $(x_k, y_j)$ may be denoted as: $(x_i, y_j) \rightarrow (x_k, y_j)$. Strap-based routing may be a gridless routing approach. If strap-based routing fails in this router, then a maze router may be used as a fall-back. The maze router may not be gridless but may have a flexible grid size based on the route being computed. N-pin nets (n>2) may be handled by decomposing them into n−1 two-pin nets.

The routing strategy for same-bit nets will now be described followed by the routing strategy for cross-bit nets.

A list of nets that need to be routed is obtained by the router. For each net, the list of end points (i.e., pins of an instance or interface pins of the block) is obtained. The nets may be sorted in decreasing order of the largest Y coordinate value of their pins. In case of a tie, the longest net may be selected first because longer nets are expected to be harder to route later. This selection approach may minimize rip-up and re-route efforts. The user can also assign precedence to a particular net by modifying its weight. By default, all nets may have unit weight. The user may assign a larger weight to critical nets in order to route it first. The net ordering scheme may be described by the following Algorithm 3.

Figure 8:
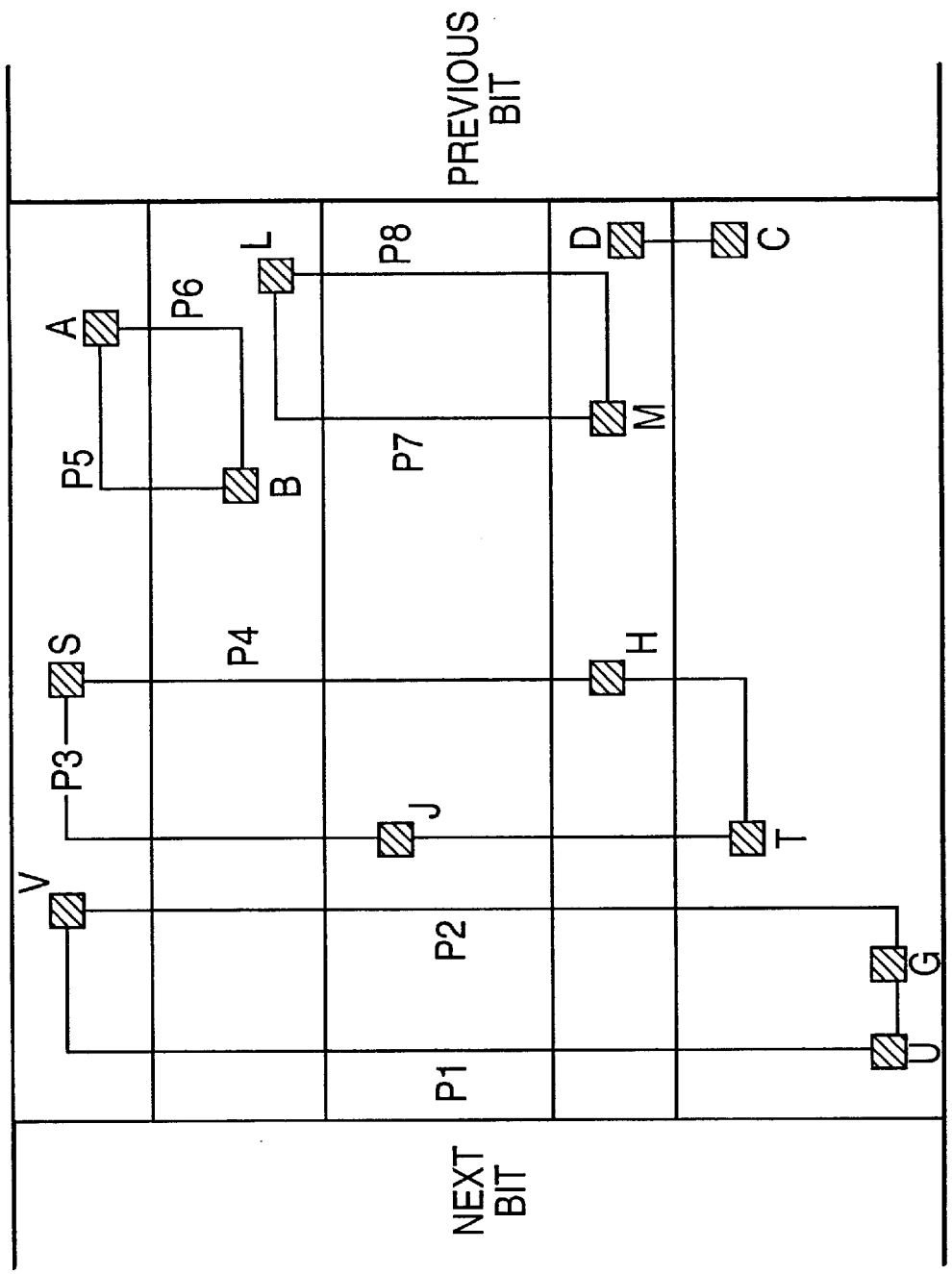
FIG. 8 is an example for routing in a single bit-slice according to an example embodiment of the present invention.

Algorithm 3: Net Ordering Process
if (special weights present) then
    WtNets=findWeightedNets(allNets)
    SortedWtNets=sortNetsByWeightDescend(WtNets)
    OtherNets=allNets−WtNets
else
    OtherNets=allNets
end if
SortedOtherNets=sortNetsByPinYCoordsDescend(OtherNets)
if (same Y for multiple nets among SortedOtherNets) then
    SameYNets=GetSameYNets(SortedOtherNets)
    SortedConflictedNets=SortByLongestLength(sameYNets)
    SortedOtherNets=ModifySortedNets(SortedConflictedNets, SortedOtherNets)
end if
SortedAllNets=SortedWtNets+SortedOtherNets
Return SortedAllNets If the two end points of a route are $(x_1, y_1)$ and $(x_2, y_2)$, then a direct route may be defined as a path that has one the following strap patterns:

Case 1: if $(x_1=x_2)$ AND $(y_1 \neq y_2)$
    Only strap (vertical): $(x_j, y_j) \rightarrow (x_j, y_2)$
Case 2: if $(x_1 \neq x_2)$ AND $(y_1=y_2)$
    Only strap (horizontal): $(x_1, y_1) \rightarrow (x_2, y_1)$
Case 3: if $(x_1 \neq x_2)$ AND $(y_1 \neq y_2)$
    Vertical-Then-Horizontal (VTH)
    First strap (vertical): $(x_1, y_1)$ $(x_1, y_2)$
    Second strap (horizontal): $(x_1, y_2) \rightarrow (x_2, y_2)$
    OR
    Horizontal-Then-Vertical (HTV)
    First strap (horizontal): $(x_1, y_1) \rightarrow (x_2, y_1)$
    Second strap (vertical): $(x_2, y_1) \rightarrow (x_2, y_2)$ The routing algorithm will now be illustrated using the representative bit-slice shown in FIG. 8. Case 1 may exist between pin D and pin C. Case 3 may exist between pin A and pin B as one example. Examples of case 3 are shown by the path P6 (vertical-then-horizontal) and the path P5 (horizontal-then-vertical). After sorting all nets with respect to the largest Y coordinate of their pins, the topmost two pins are the pins V and S. The net associated with the pin V may be selected as the first routing candidate since it would have a longer potential vertical strap (from the pin V to the pin S). Longer nets are harder to route later on and often cause timing problems. Since it is desirable to minimize the number of vias, a direct route is first desired. Both the vertical-then-horizontal direct route and the horizontal-then-vertical direct route are checked to determine whether either of these routes intersect with any pin/blockage. In this example of FIG. 8, the path P2 (vertical-then-horizontal direct route) intersects with the pin G. Thus, the path P1 may be chosen as the route between the pin V and the pin U. If there is no blockage in the path P2, then any of those two paths may be taken as the final route.

Another scenario that may occur is that both the vertical-then-horizontal direct route and the horizontal-then-vertical direct route may intersect some pin/blockage. In the FIG. 8 example, the connection between the pin S and the pin T illustrates this scenario. The pins J and H block both direct paths (P3 and P4, respectively). Therefore, a 3-strap path may be attempted from both the direct paths. To denote the coordinates of any pin, the pin A may be located at $(x_A, y_A)$, the pin B may be located at $(x_B, y_B)$ and so on. To form a 3-strap path from two direct paths, the following may be done:

If $(y_H<y_J)$ and
    there exists a legal strap $(x_s, y_s) \rightarrow (x_H, y_H)$.
    there exists a legal strap $(x_J, y_J) \rightarrow (x_T, y_T)$.
    If it is determined that a legal strap exist from $(x_H, y_H) \rightarrow (x_J, y_H)$ then the routine is done. Otherwise, the existence of a strap $(x_H, y^*) \rightarrow (x_J, y^*)$ for $y_H \leq *y \leq y_J$ is searched. If such a strap is not found, then 5-strap routes may be searched.

On the other hand, if $(y_H>y_J)$ and
    there exists a legal strap $(x_s, y_s) \rightarrow (x_J, y_s)$.
    there exists a legal strap $(x_T, y_T) \rightarrow (x_H, y_T)$.
    A vertical strap $(x^*, y_T) \rightarrow (x^*, y_s)$ is attempted to be found where $x_T \leq x_* \leq x_s$. If successful, then a 3-strap route is obtained. Otherwise, the bounding box of the vertical strap finder may be extended to $(x_T-\text{width})<x_I<(x_T+2 \cdot \text{Width})$, where width=$x_s-x_T$.

Both the above cases are based on the assumption that the vertical straps of direct routes exhibit an intersection with some pin/blockage. Such conflicts can also occur for horizontal straps (or for both vertical and horizontal straps). These problems may be similarly handled.

It should be ensured that there is no minimum spacing rule violation between two straps placed next to each other.

Once done routing the nets originating from the topmost row (i.e., the nets between V–U, S–T, and A–B), the nets originating from the next row down from the top may be routed. The net connecting the pin L and the pin M may be selected next. By routing nets one row at a time, the possibility of a conflict with routes in lower rows may be minimized. To handle conflicts between an existing route and a new route, existing routes may be ripped-up. Rip-up efforts may be minimized by allowing only one-degree of rip-up. That is, in fixing a problem for a particular route, only those nets that directly block its path are ripped-up. When the ripped-up net is re-routed, it may use routing regions that have been utilized already in order to minimize the possibility of rip-up/re-route being invoked on that net again.

As a fall-back mechanism when a strap-based route cannot be found, a maze routing algorithm may be implemented.

The routing strategy for cross-bit nets will now be discussed. In explaining this type of strategy, the maximum degree of forward/backward cross-connectivity is k. One method to route this design may be to route k+1 consecutive bit-slices as a single unit. Such an approach may result in longer run-times and may guarantee irregular routes for different nets in a net-cluster. In embodiments of the present invention, a single representative bit-slice may be routed by inferring cross-bit connections while performing the routing.

A single net may be modeled, spread over multiple bit-slices, as a combination of multiple smaller sub-nets each confined within a single bit-slice. As a result, only one such sub-net explicitly belongs to the representative bit-slice. Other sub-nets belong to other bit-slices. The sub-nets of other bit-slices may be virtually instantiated into the representative bit-slice when routing. Virtual instantiation of a sub-net implies treating the sub-net as a part of the representative bit-slice while routing. After routing, the actual sub-net route may be reinstated back to its original bit-slice. This method of modeling cross-bit nets may save run-time, memory and ensure regularity of the resulting design.

Figure 9:
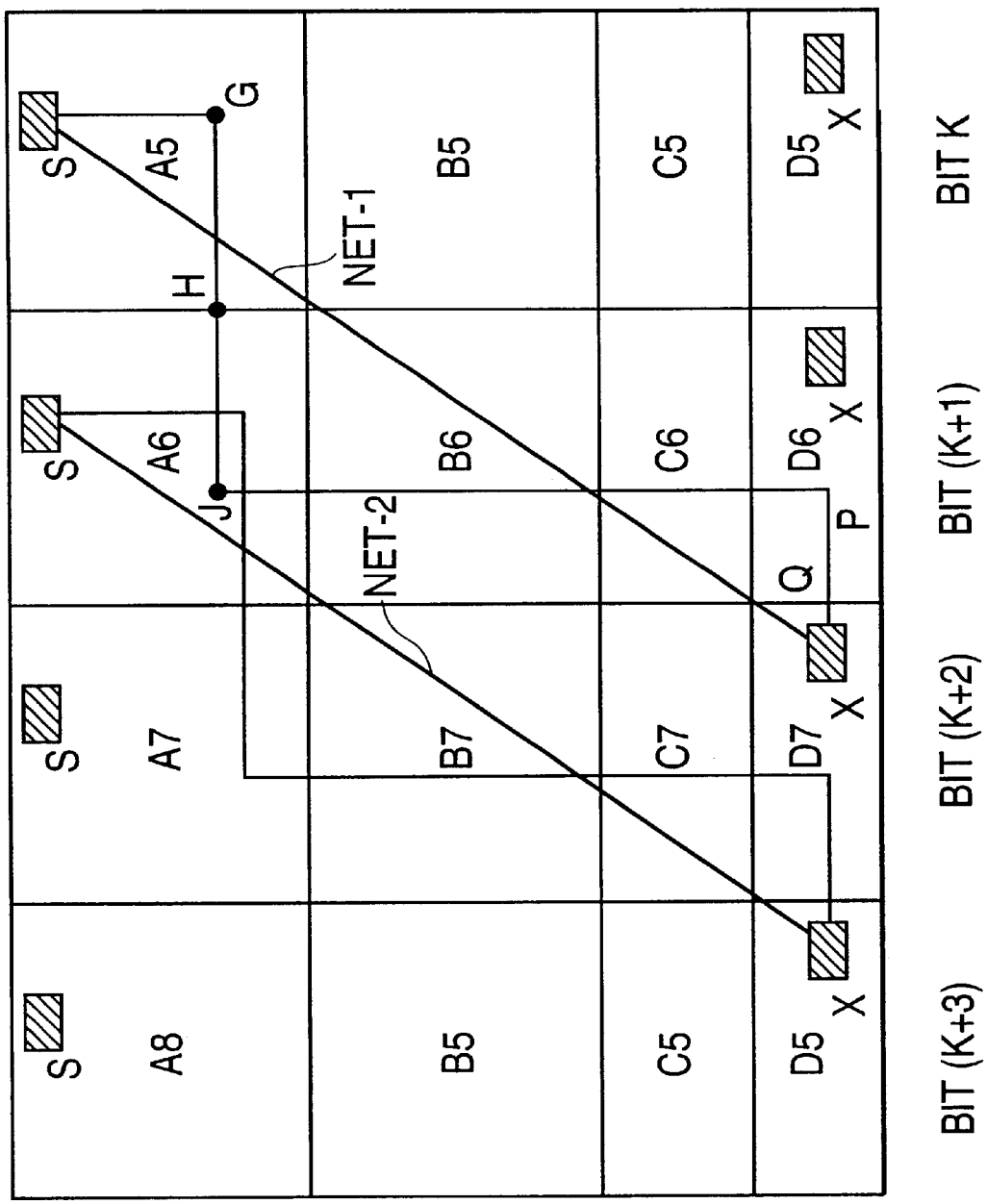
FIG. 9 is an example of routing of cross-bit nets according to an example embodiment of the present invention.

FIG. 9 shows four bit-slices of a datapath design having a forward cross-connectivity of degree 2. The representative bit-slice is assumed to be the bit-slice k (i.e., the right-most bit-slice in the figure). Net-1 connects the pin S of the instance A5 (in bit-slice k) to the pin X of the instance D7 (in bit-slice k+2). Net-1 belongs to a net-cluster that has other member nets as well. For ease of illustration, only one other net (Net-2) of this net-cluster is shown.

One objective is to route all cross-bit nets with just the data of the representative bit-slice (bit-slice k) loaded in memory. The algorithm for finding routes may be the same as that for same-bit nets with a few modifications to handle cross-bit nets. To obtain the route for Net-1, three bit-slices may be traversed because the degree of cross-bit connectivity is 2. Therefore, whenever attempting to extend a horizontal strap to some location in the adjacent bit, the strap may be split into two straps such that each strap is confined to a single bit-slice. In the example of Net-1, a strap from pin S (in instance A5) to point G (in instance A5) is first obtained. Next, a horizontal strap is created from point G (in instance A5) to point J (in instance A6). In order to illustrate the mechanism by which to model this strap using a single representative bit-slice, the following splitting may occur:

$(x_G, y_G) \rightarrow (x_J, y_J) = (x_G, y_G) \rightarrow (x_H, y_H) + (x_H, y_H) \rightarrow (x_J, y_J)$, where H is a point on the bit-slice boundary and $y_H = y_G = y_J$.

Figure 10:
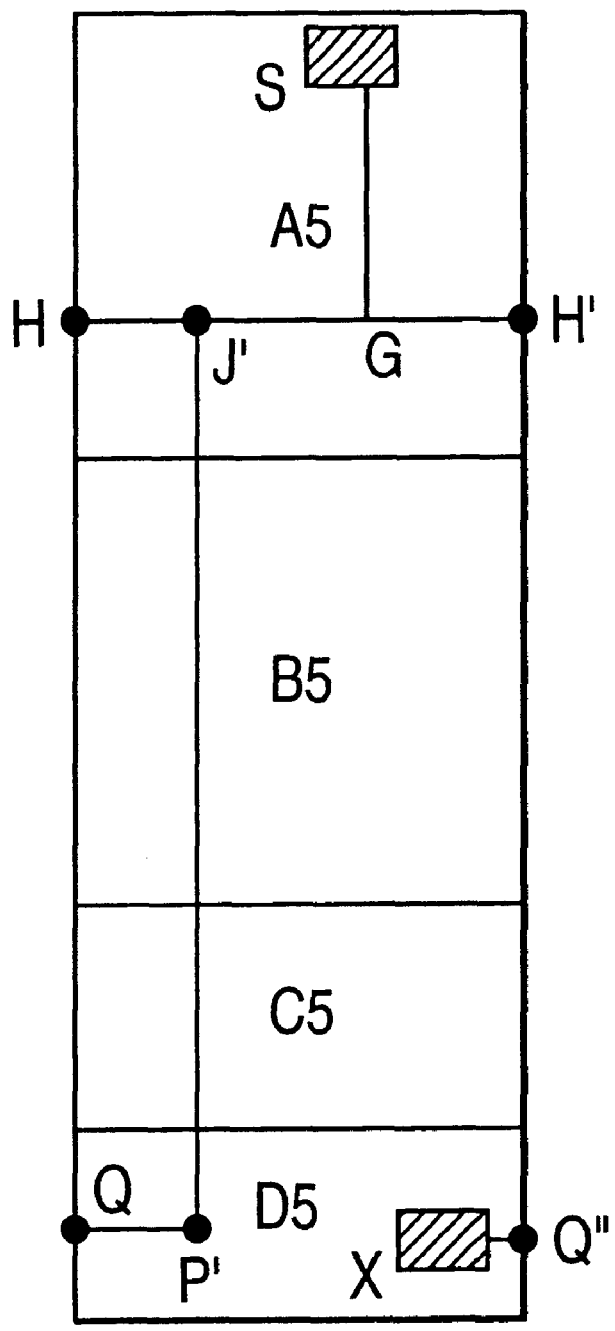
FIG. 10 is an example of a representative bit-slice with virtual instantiations of sub-nets according to an example embodiment of the present invention.

The pins (and points) of other bit-slices may be virtually instantiated into the representative bit-slice. FIG. 10 shows the representative bit-slice for the datapath design of FIG. 9 with the virtual instantiations performed. The point J is virtually instantiated within the representative bit-slice k by incrementing the X coordinate of the point J by a bit-pitch. In FIG. 10, the virtual point is denoted as J'. Similarly, the point H may be virtually instantiated as the point H' in the bit-slice k. Once these points have been instantiated, the $(x_H, y_H) \rightarrow (x_J, y_h)$ strap of bit-slice (k+1) may be instantiated within the $k^{th}$ bit-slice as a strap $(x^1_H, y^1_H) \rightarrow (x^1_J, y^1_J)$. Depending on the location of points J and G, an overlap may occur between the straps $(x_G, y_G) \rightarrow (x_H, y_H)$ and $(x^1_H, y^1_H) \rightarrow (x^1_J, y^1_J)$. This virtual overlap may not be a problem because the overlapping straps belong to the same net. After routing, the virtual straps may be reinstated to their actual bit-slices which may solve the overlap problem. Once the virtual destination pin is reached, then the reverse mapping may be performed of all virtual locations to their original locations to get the legal straps. The same virtual instantiation approach may be taken for vertical straps such as $(x_J, y_J) \rightarrow (x_P, y_P)$.

Following this approach, real overlaps may occur in the horizontal straps of cross-bit nets belonging to same net-cluster. In FIG. 9, Net-1 and Net-2 belong to the same net-cluster. If the routes of Net-1 are propagated to generate the routes for Net-2, then horizontal overlaps may be obtained between coordinates $(x_J, y_J)$ and $(x_s, y_J)$ in the instance A6 resulting in an incorrect design. To avoid this problem, the algorithm may be fine-tuned. The horizontal span between the source pin and the destination pin (in terms of number of bit-slices) may be found. In FIG. 9, the horizontal span between the pin S (the source pin) and the pin X (the destination pin) is two. Thus, there can potentially be overlap with a similar net in an adjacent bit-slice. To solve this problem, two different routes may be generated for that net. In general, if the horizontal span between the source pin and the destination pin is p, then p different routes may be generated for that net-cluster. However, then p horizontal straps may be reserved for a single net. In industrial designs, however, the value of p may not be high (usually no more than 4) and therefore this is not a problem when routing industrial datapath blocks.

Propagation of the routes (block 24 in FIG. 3) will now be described. After performing the routing of the representative bit-slice, the virtual routes may now be propagated to other bit-slices. The previously formed net-cluster information may be used. Algorithm 4 describes a route propagation scheme for same-bit connections. This algorithm may be summarized as follows. All the nets in the representative bit-slice k may be obtained. For each master net, the other (sister) nets in the corresponding net-cluster may be found. By modifying the route of the master net, distinct routes for each sister net within the ModifyRoute( ) function may be created. The SisterRoute may be created by the following calculations:

Y co-ord of SisterRoute pins=Y co-ord of MasterRoute pins

X co-ord of SisterRoute pins=X co-ord of MasterRoute pins+(MasterNetBit−SisterNetBit) Bit-Pitch Once the route propagation is complete for all the nets present in the representative bit-slice, a design-rule correct route may be obtained for all the bit-slices and the routing task is completed.

Algorithm 4: Route Propagation (for Same-Bit nets)
AllNets=getAllNets(k)
for each net (MasterNet) in AllNets do
   MasterRoute=getRouteForNet(MasterNet)
   NetCluster=getNetClusterForNet(MasterNet)
   OtherSisterNets=getSisterNets(NetCluster, MasterNet)
   for each net (SisterNet) in OtherSisterNets do
     SisterRoute=ModifyRoute(MasterRoute, SisterNet, MasterNet)
     AssignRoute(SisterNet, SisterRoute)
   end for
end for Route propagation may change slightly for cross-bit connections. As mentioned previously, if the horizontal span between the source pin and the destination pin of a cross-bit net is p bit-slices, then p different routes may be constructed for that net. Now, the correct route may be propagated to individual bit-slices. Algorithm 5 describes a technique for route propagation of cross-bit nets.

Algorithm 5: Route Propagation (for Cross-Bit nets)
    AllCrossBitNets=getAllCrossBitNetsWithSourceInBit(k)
    for each net (MasterNet) in AllCrossBitNets do
        MasterRoutes=getMasterRoutes(MasterNet, p)/* MasterRoutes is an array of p routes */
        MasterRoute=MasterRoutes[0]
        NetCluster=getNetClusterForNet(MasterNet)
        OtherSisterNets=getSisterNets(NetCluster, MasterNet)
        for each net (SisterNet) in OtherSisterNets do
            NewSourceBit=getSourceBit(SisterNet)
            PositiveBitDiff=NewSourceBit-k+N
            ModValue=(PositiveBitDiff modulus p)
            SisterRoute=ModifyRoute(MasterRoutes[Modvalue], SisterNet, MasterNet)
            AssignRoute(SisterNet, SisterRoute)
        end for
    end for It may then be determined whether any unrouted nets are present in the design. If any nets have not been routed, then the strap-based routing scheme may be invoked to route these nets.

Embodiments of the present invention provide a unique routing approach that has several advantages over traditional routing schemes. These advantages may include: (1) speed of routing; (2) easy incremental routing; (3) predictable routes; and (4) better debuggability and timing.

For example, by exploiting datapath regularity, the above described routing technique may route an entire datapath while explicitly routing only a small subset of the nets of the datapath block. This may make it possible to route large industrial datapaths with significantly shorter run-times as compared with the time taken by a traditional router.

Before a design is taped out, several iterations of routing and timing checks may be performed. Often designers spend a significant amount of time in these iterations. In these iterations, designers often minimally modify the design. In such a scenario, the router may perform efficient incremental routing. With the approach described in embodiments of the present invention, incremental routing is easy to perform. Using the free space obtained due to the removal of routes that were attached to the removed instances, the router can route the nets efficiently. All previously generated routes may be considered blockages, and therefore the problem size is smaller. A similar scenario may arise when some net-cluster does not meet the timing constraints. Because of the inherent speed and the incremental nature of the routing technique, advantages are gained in such situations as well.

The routes obtained by the above described routing technique may be highly regular across bit-slices. As a result, the wiring parasitics for different nets in a net-cluster may be very similar thereby resulting in predictable designs and also simplifying the task of timing estimation of the resulting layout in an accurate and efficient manner.

In the above described routing technique, all the nets in a net-cluster may have similar routes. This regularity is very desirable. If a datapath routed using conventional routers does not meet timing requirements, the designer may spend a significant amount of time trying to find the badly routed net. This may be required if a manual routing fix is planned. Alternately, the designer may redo the routing process, possibly with special constraints to route the critical nets first. However, the potential irregularity of the routed nets may cause a ripple effect thereby making some other nets critical. In the flow of the above described routing techniques, all nets in a net-cluster may have substantially similar delays due to the similarity of the routes of different nets in a net-cluster. As a result, either timing problems are fixed or all nets in a net-cluster may be unable to meet timing. This may allow better and more predictable timing characteristics of the design and ease the debugging task.

In at least one embodiment of the present invention, the above described routing technique may be implemented in the C++ programming language and stored on a program storage device. Other programming languages are also within the scope of the project invention.

Figure 11:
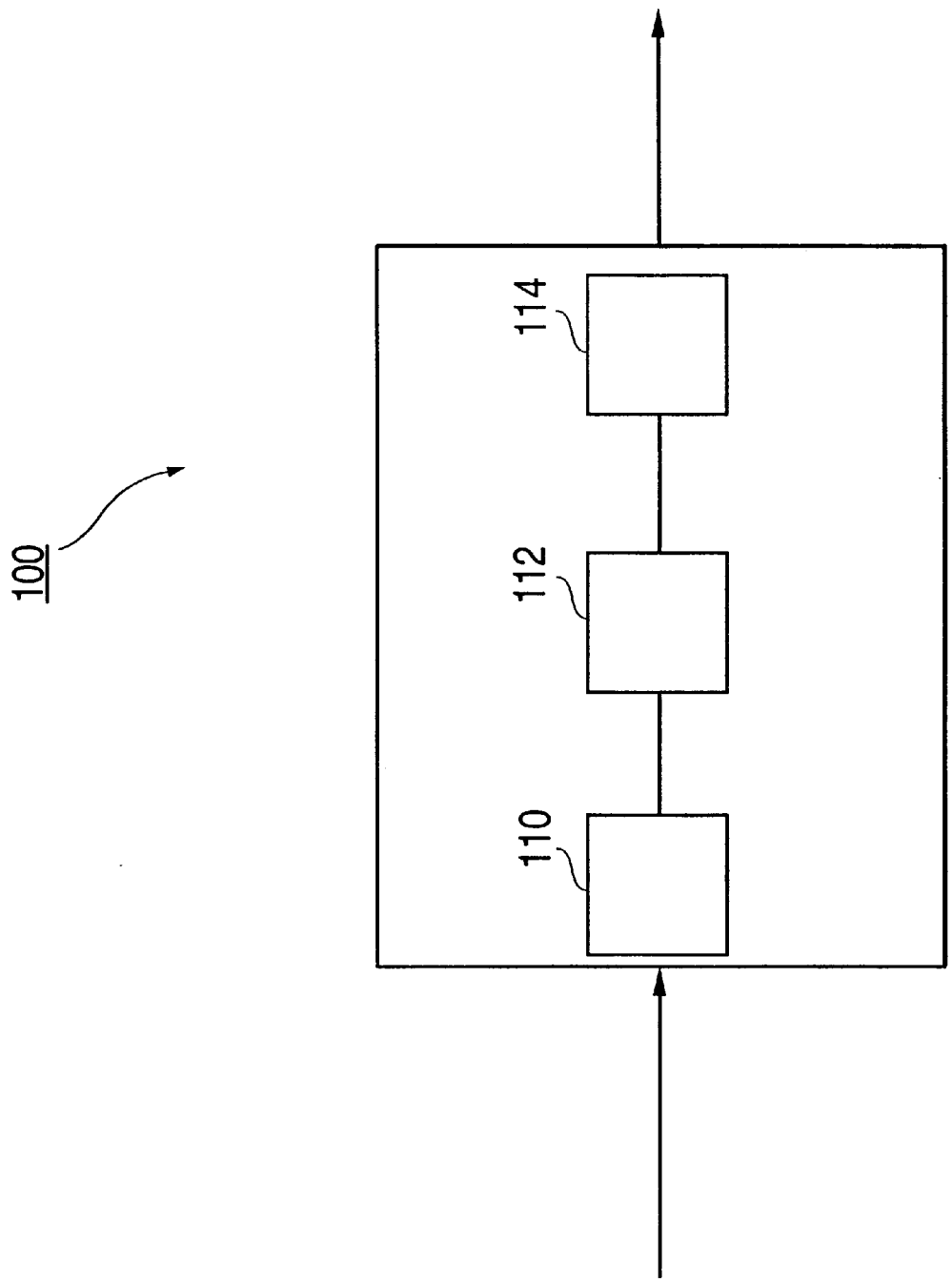
FIG. 11 illustrates a routing apparatus according to an example embodiment of the present invention.

The methodologies described above may be provided within software (or software routines). The methodology, mechanism, algorithm and/or routine may also be provided on a program storage device (such as a disk for example) that is readable by a machine (such as a computer system) and include a program of instructions that are executable by the machine to perform the methodology, algorithm and/or routine. For example, FIG. 11 illustrates a routing apparatus 100 that may include the software to perform the above-described methodologies. The apparatus may include an input device 110 to receive data relating to the datapath design as well as to provide an interface with a user. A processor device 112 may be coupled to the input device 110 to perform the processing of the above-described methodology. An output device 114 may be further coupled to the processor 112 so as to provide an output of the finished datapath design after the processing by the processor device 112. This output may be in a number of forms such as on a display, on a hard copy (i.e., paper) or on a program storage medium. Other embodiments and configurations of the routing device are also within the scope of the present invention.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method comprising:
    extracting regularity among routing connections of a datapath design to form net clusters;
    selecting a representative bit-slice of said datapath design;
    routing one representative net from one of said net clusters in the representative bit-slice; and
    propagating the route of each said routed net in each said net cluster to remaining routes in each said net cluster.

2. The method of claim 1, further comprising determining a set of net-clusters prior to said routing.

3. The method of claim 2, wherein said set of net-clusters are determined using a clustering methodology based on names of structures within said datapath design.

4. The method of claim 2, wherein said set of net-clusters are determined using a clustering methodology based on coordinates of structures within said datapath design.

5. The method of claim 2, wherein said set of net-clusters are determined using a first clustering methodology based on names of structures within said datapath design and using a second clustering methodology based on coordinates of structures within said datapath design.

6. The method of claim 2, wherein said set of net-clusters comprise similarly structured nets.

7. The method of claim 6, wherein said routing comprises routing one representative net of each said net cluster.

8. The method of claim 1, wherein said routing comprises routing a same-bit net.

9. The method of claim 1, wherein said routing comprises routing a cross-bit net.

10. The method of claim 1, wherein said propagating comprises propagating said route of said representative net to another bit-slice, said propagated route being similar to said route of said representative net.

11. The method of claim 1, wherein said propagating is based on regularity of said datapath design.

12. The method of claim 1, further comprising:
routing a subsequent net related to said representative bit-slice; and
propagating said route of said subsequent net to other nets in net clusters of said subsequent net.

13. The method of claim 1, further comprising determining schematic/layout information of the datapath design prior to extracting regularity among routing connections.

14. A method comprising:
determining a route of a representative net for a bit-slice of a datapath design; and
propagating said route of said representative net to other nets similar to said representative net.

15. The method of claim 14, further comprising selecting a representative bit-slice prior to said determining said route.

16. The method of claim 14, wherein said determining said route comprises routing a same-bit net.

17. The method of claim 14, wherein said determining said route comprises routing a cross-bit net.

18. The method of claim 14, further comprising determining a set of net-clusters prior to said determining, and selecting one of said net-clusters for routing.

19. The method of claim 18, wherein said set of net-clusters are determined using a clustering methodology based on names of structures within said datapath design.

20. The method of claim 18, wherein said set of net-clusters are determined using a clustering methodology based on coordinates of structures within said datapath design.

21. The method of claim 18, wherein said set of net-clusters are determined using a first clustering methodology based on names of structures within said datapath design and using a second clustering methodology based on coordinates of structures within said datapath design.

22. The method of claim 18, wherein said set of net-clusters comprise similarly structured nets.

23. The method of claim 18, wherein said routing comprises routing a net of said net-cluster within said set of net-clusters.

24. The method of claim 14, wherein said propagating is based on regularity of said datapath design.

25. The method of claim 14, further comprising:
determining a route of a subsequent representative net of a subsequent net cluster of said structure; and
propagating said route of said subsequent representative net to another structure of said design.

26. The method of claim 14, further comprising determining schematic/layout information of the datapath design prior to the determining the route of the representative net.

27. An apparatus for routing a datapath design having a plurality of bit-slices, said apparatus comprising:
an input device to receive data relating to said datapath design; and
a routing device to couple to said input device so as to receive said data and including a processor device to route a representative net related to a representative bit-slice and to propagate said route of said representative net to a net related to a subsequent bit-slice.

28. The apparatus of claim 27, further comprising an output device to provide a completed routing of said datapath design based on operations of said processor device.

29. The apparatus of claim 27, wherein said processor device further determines a set of net-clusters prior to said routing, and selects one of said net-clusters for routing.

30. The apparatus of claim 27, wherein said processor device propagates said route based on regularity of said datapath design.

31. A program storage device readable by machine, tangibly embodying a program of instructions executable by the machine to perform a method comprising:
extracting regularity among routing connections of a datapath design to form net clusters;
selecting a representative bit-slice of said datapath design;
routing one representative net from one net cluster in the representative bit-slice; and
propagating the route of each said routed net in each said net cluster to remaining routes in each said net cluster.

32. The program storage device of claim 31, said method further comprising determining a set of net-clusters prior to said routing, and said selecting comprises selecting one of said net-clusters for routing.

33. The program storage device of claim 31, wherein said propagating comprises propagating a route related to said subsequent bit-slice, said subsequent route being similar to said representative route.

34. The program storage device of claim 31, wherein said propagating is based on regularity of said datapath design.

35. The program storage device of claim 31, the method further comprising determining schematic/layout information of the datapath design prior to extracting regularity among routing connections.

36. A method comprising:
determining a route of a representative net for a structure of a datapath design; and
propagating said route of said representative net to other nets similar to said representative net, said propagating being based on regularity of said datapath design.

37. The method of claim 36, wherein the structure comprises a bit-slice.

38. A method comprising:
determining a route of a representative net for a structure of a datapath design;
propagating said route of said representative net to other nets similar to said net;
determining a route of a subsequent representative net of a subsequent net cluster of said structure; and
propagating said route of said subsequent representative net to another structure of said design.

39. The method of claim 38, wherein the structure comprises a bit-slice.

40. The method of claim 38, wherein said propagating being based on regularity of said datapath design.

41. A method comprising:
  determining schematic/layout information of a datapath design;
  determining a route of a representative net for a structure of the datapath design; and
  propagating said route of said representative net to other nets similar to said representative net.

42. The method of claim 41, wherein the structure comprises a bit-slice.

43. The method of claim 41, wherein said propagating being based on regularity of said datapath design.

* * * * *